United States Patent
Bavisi et al.

(10) Patent No.: US 7,468,642 B2
(45) Date of Patent: Dec. 23, 2008

(54) MULTI BAND PASS FILTERS

(75) Inventors: Amit Bavisi, Williston, VT (US); Essam Mina, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 11/609,413

(22) Filed: Dec. 12, 2006

(65) Prior Publication Data

US 2008/0136560 A1    Jun. 12, 2008

(51) Int. Cl.
H03H 7/01    (2006.01)
(52) U.S. Cl. .................. 333/168; 333/175; 333/202
(58) Field of Classification Search ............. 333/168, 333/175–176, 32, 202
See application file for complete search history.

(56) References Cited

U.S. PATENT DOCUMENTS

| | | | |
|---|---|---|---|
| 4,454,487 A * | 6/1984 | Darmouni | 333/28 R |
| 5,543,758 A | 8/1996 | Wey | |
| 5,815,804 A | 9/1998 | Newell et al. | |
| 6,147,571 A | 11/2000 | Kitazawa et al. | |
| 6,300,849 B1 * | 10/2001 | Takeda | 333/202 |
| 6,674,337 B2 | 1/2004 | Hashemi et al. | |
| 6,917,815 B2 | 7/2005 | Hajimiri et al. | |
| 7,071,798 B2 * | 7/2006 | Gomez et al. | 333/219 |
| 7,116,186 B2 | 10/2006 | Chen | |
| 2006/0145781 A1 | 7/2006 | Layne et al. | |

OTHER PUBLICATIONS

Bairavasubramanian, et al.; Dual-Band Filters for WLAN Applications on Liquid Crystal Polymer Technology; 2005 IEEE 0-7803-8846-1/05; pp. 533-536.

(Continued)

*Primary Examiner*—James H Cho
(74) *Attorney, Agent, or Firm*—Schmeiser, Olsen & Watts; Riyon Harding

(57) ABSTRACT

A multi-band band pass filter, including: first and second multi-order asynchronous resonators connected to each other by a coupling resonator and connected to respective first and second matching resonators, the first matching resonator connected to a signal-in terminal and second matching resonator connected to a signal-out terminal respectively; a first reference resonator connected between the signal-in terminal and a reference-in terminal and a second reference resonator connected between the signal-out terminal and a reference-out terminal, the first multi-order asynchronous resonator connected between the first matching resonator and the coupling resonator to the first reference terminal and the second multi-order asynchronous resonator connected between the second matching resonator and the coupling resonator to the reference-out terminal, the reference-in terminal connected to the reference-out terminal; and a feedback resonator connected between the signal-in terminal and the signal-out terminal.

8 Claims, 2 Drawing Sheets

OTHER PUBLICATIONS

Tsai, et al.; Planar Filter Design With Fully Controllable Second Passband; IEEE Transactions on Microwave Theory and Techniques, vol. 53, No. 11, Nov. 2005; 2005 IEEE 0018-9480; pp. 3429-3439.

Tsai, et al.; Dual-Band Bandpass Filters Using Equal-Length Coupled-Serial-Shunted Lines and Z-Transform Technique; IEEE Transactions on Microwave Theory and Techniques, vol. 52, No. 4, Apr. 2004; 2004 IEEE 0018-9480/04; pp. 1111-1117.

Palazzari, et al.; Design of an Asymmetrical Dual-Band WLAN Filter in Liquid Crystal Polymer (LCP) System-On-Package Technology; IEEE Microwave and Wireless Components Letters, vol. 15, No. 3, Mar. 2005; 2005 IEEE 1531-1309; pp. 165-167.

Quendo, et al.; An Original Topology of Dual-Band Filter with Transmission Zeros; 2003 IEEE MTT-S Digest; 0-7803-7695-1/03; pp. 1093-1096.

Miyake, et al.; A Miniaturized Monolithic Dual Band Filter Using Ceramic Lamination Technique For Dual Mode Portable Telephones; 1997 IEEE MTT-S Digest; 0-7803-3814-6/97; pp. 789-792.

* cited by examiner

MULTI BAND PASS FILTERS

FIELD OF THE INVENTION

The present invention relates to the field of bandpass filter circuits; more specifically, it relates to multi bandpass radio frequency filter having single input port and a single output port.

BACKGROUND OF THE INVENTION

Currently, in devices that support more than one radio frequency band, separate radio-frequency bandpass filters are required. In integrated circuit chip applications, each bandpass filters occupies significant chip area and routing circuits must be provided to select the appropriate filter, which also uses chip area and complicates the integrated circuit design. Accordingly, there exists a need in the art to overcome the deficiencies and limitations described hereinabove.

SUMMARY OF THE INVENTION

A first aspect of the present invention is a multi band pass filter, comprising: first and second multi-order asynchronous resonators connected to each other by a coupling resonator and connected to respective first and second matching resonators, the first matching resonator connected to a signal-in terminal and second matching resonator connected to a signal-out terminal respectively; a first reference resonator connected between the signal-in terminal and a reference-in terminal and a second reference resonator connected between the signal-out terminal and a reference-out terminal, the first multi-order asynchronous resonator connected between the first matching resonator and the coupling resonator to the first reference terminal and the second multi-order asynchronous resonator connected between the second matching resonator and the coupling resonator to the reference-out terminal, the reference-in terminal connected to the reference-out terminal; and a feedback resonator connected between the signal-in terminal and the signal-out terminal.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The term "order" refers to the mathematical order or highest exponent of the equation that predicts the frequency behavior of a particular inductive/capacitive filter element or resonator circuit. The term duplicate circuits is defined as circuits that are identically designed and will theoretically function identically. However, the physical circuit components inductance values of inductors, capacitance values of capacitors and resistance of interconnecting wires may vary slightly due to manufacturing tolerances. Identical circuits will perform to the same performance specification, particularly in terms of radio frequency.

Figure 1:
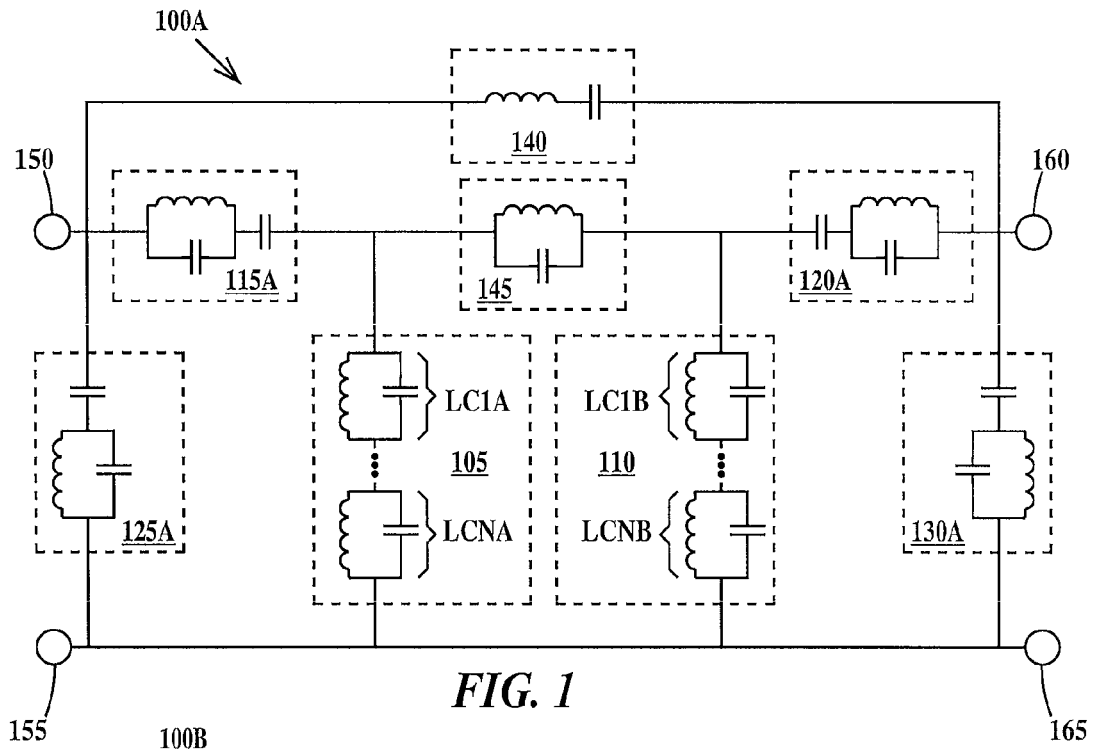
FIG. 1 is a circuit diagram of a bandpass filter is according to the present invention.

FIG. 1 is a circuit diagram of a bandpass filter is according to the present invention. In FIG. 1 a bandpass filter 100A includes an asynchronous first multi-order resonator 105, an asynchronous second multi-order resonator 110, a first matching resonator 115A, a second matching resonator 120A, an first reference resonator 125A, a second reference resonator 130A, a feedback resonator 140, a coupling resonator 145, a signal-in terminal 150, a reference-in terminal 155, a signal-out terminal 160 and a reference-out terminal 165. Signal-in terminal 150 and reference-in terminal 155 comprise an input port and signal-out terminal 160 and reference-out terminal 165 comprise and output port. Resonators 105 and 110 are duplicates of each other. Resonators 115A and 120A are duplicates of each other. Resonators 125A and 130A are duplicates of each other.

Resonators 105 comprises n second order resonators LC1A to LCNA connected in series. Each individual second-order resonator LC1A to LCNA comprises an inductor and a capacitor connected in parallel. Each second-order resonator LC1A to LCNA is tuned to pass a different range (or band) of radio frequency (e.g. have different resonant frequencies). The second order resonators together also perform the function of rejecting frequencies between the two passbands. Resonators 110 comprises n second order resonators LC1B to LCNB connected in series. Each individual second-order resonator LC1B to LCNB comprises an inductor and a capacitor connected in parallel. Each second-order resonator LC1A to LCNA is tuned to pass a different range (or band) of radio frequency. Each second order resonator LC1A to LCNA of resonator 105 passes the same radio frequency bandwidth as corresponding second order resonators LC1B to LCNB of resonator 110. In one example, the radio peak frequency passed by each second order resonator LC1A to LCNA (or LC1B to LCNB) increases from second order resonator LC1A to LCNA (or LC1B to LCNB). n is a positive integer of 2 or more. When n=2, resonators 105 and 110 are forth order resonators.

Resonators 115A, 120A, each comprise a first capacitor connected in series with a second capacitor and an inductor connected in parallel. Resonators 125A, 130A, each comprise a first capacitor connected in series with either a second capacitor and an inductor connected in parallel or a just the inductor (i.e. the second capacitor is optional). Resonator 140 comprises an inductor in series with a capacitor. Resonator 145 comprises an inductor connected in parallel with a capacitor. All capacitors in FIG. 1 are fixed capacitors.

Resonator 115A is connected between signal-in terminal 150 and a first terminal of resonator 145. Resonator 120A is connected between signal-out terminal 160 and a second terminal of resonator 145. First terminals of resonator 105, resonator 110, resonator 125A and resonator 130A are connected to both reference-in terminal 155 and reference-out terminal 165. The wire connecting reference-in terminal 155 and reference-out terminal 165 may be considered a reference bus. In an example reference bus is held at ground or zero volts. A second terminal of resonator 105 is connected between resonator 115A and resonator 145. A second terminal of resonator 110 is connected between resonator 120A and resonator 145. A second terminal of resonator 125A is connected to signal-in terminal 150. A second terminal of resonator 130A is connected to signal-out terminal 150. Resonator 140 is connected between signal-in terminal 150 and signal-out terminal 160.

Since bandpass filter 100A is symmetrical about resonator 140 and resonator 145, the input and output ports may be interchanged.

Bandpass filter 100A, when n=2, generates a first pass band and a second pass band about two respective selected frequencies. First multi-order resonator 105 and second multi-order resonator 110 control the value of the two selected frequencies. First reference resonator 125A and second reference resonator 130A attenuate the two selected frequencies, which might be between the two passbands or any other desired frequency. Feedback resonator 140 provides a transmission zero beyond the second pass band and port matching. Coupling resonator 145 controls the pass bandwidth of the lower of the two selected frequencies. The pass band roll-off of the first pass bands is controlled by the quality factor (Q) of the coupling resonator 145. Feedback resonator 140 matches both ports at the selected frequencies. For port matching, the ratio of the inductance to capacitance of resonator 140 should be equal to the square to the port impedances. First reference resonator 125A and second reference resonator 130A control the pass bandwidth of the higher of the two selected frequency. First matching resonator 115A and second matching resonator 1120A control the rejection at frequencies between the two pass bands and beyond the higher pass band. The spacing between the two pass bands is controlled by the transmission zeros between the two frequencies. Hence, the two pass bands can be separated by a single notch allowing close spacing between the bands.

Bandpass filter 100A (and 100B, 100C and 100D described infra) can be integrated on silicon and/or high-Q packages to accurately and independently control the center frequencies and pass bands. The product of the ratio of the two bandwidths ($\Delta_2/\Delta_1$) and ratio of frequencies can exceed 10 as compared to 4, which is maximum available from current design techniques.

Figure 2:
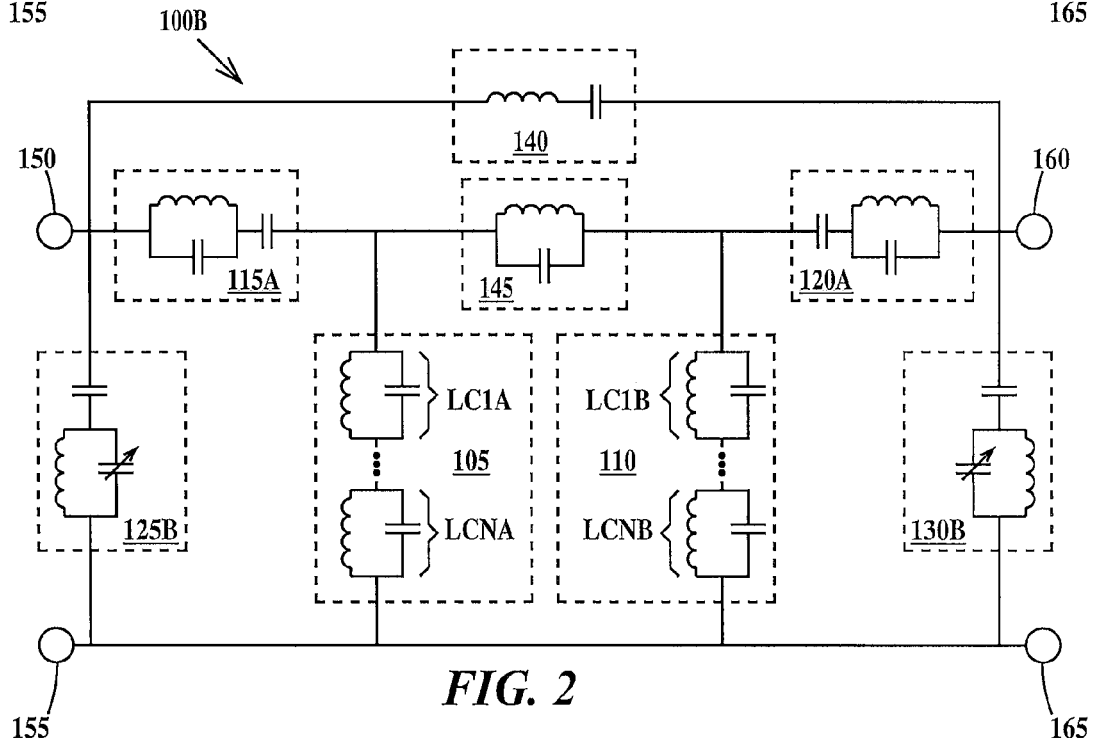
FIG. 2 is a first modified form of the circuit of FIG. 1.

FIG. 2 is a first modified form of the circuit of FIG. 1. In FIG. 2, a bandpass filter 100B is similar to bandpass filter 110A of FIG. 1, except the parallel capacitors of first reference resonator 125B and of second reference resonator 130B are variable capacitors. First reference resonator 125B and second reference resonator 130B are duplicates of each other.

Figure 3:
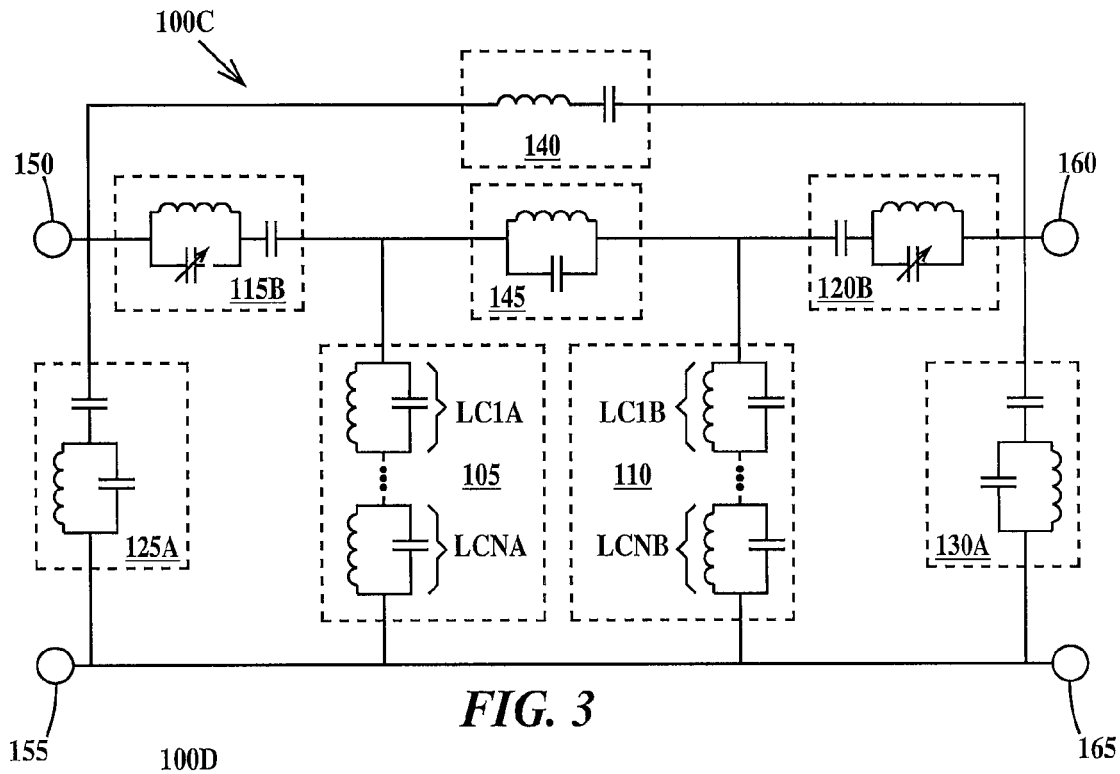
FIG. 3 is a second modified form of the circuit of FIG. 1.

FIG. 3 is a second modified form of the circuit of FIG. 1. In FIG. 3, a bandpass filter 100C is similar to bandpass filter 110A of FIG. 1, except the parallel capacitors of first matching resonator 115B and of second matching resonator 120B are variable capacitors. First matching resonator 115B and of second matching resonator 120B are duplicates of each other.

Figure 4:
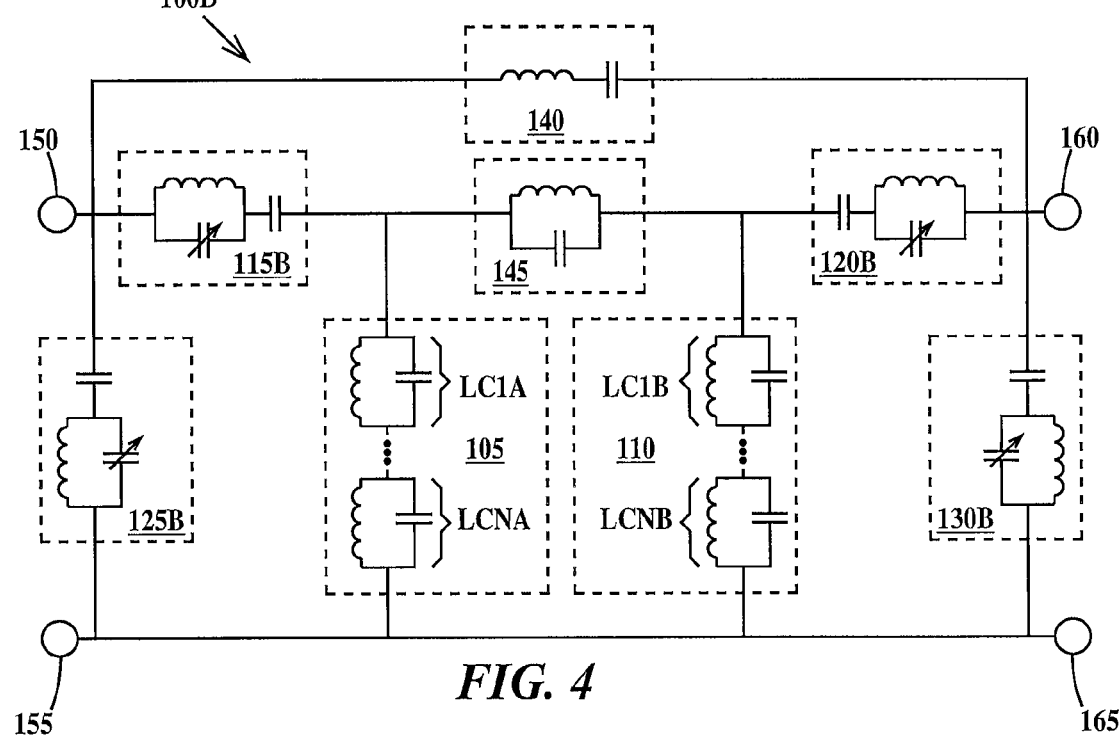
FIG. 4 is a third modified form of the circuit of FIG. 1.

FIG. 4 is a third modified form of the circuit of FIG. 1. In FIG. 4, a bandpass filter 100D is similar to bandpass filter 110A of FIG. 1, except the parallel capacitors of first reference resonator 125B and of second reference resonator 130B are variable capacitors and the parallel capacitors of first matching resonator 115B and of second matching resonator 120B are variable capacitors.

Thus the present invention provides single physical filters capable of passing multiple different frequency bands and which overcomes the deficiencies and limitations cited supra.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A multi-band band pass filter, comprising:
   first and second multi-order asynchronous resonators connected to each other by a coupling resonator and connected to respective first and second matching resonators, said first matching resonator connected to a signal-in terminal and second matching resonator connected to a signal-out terminal respectively;
   a first reference resonator connected between said signal-in terminal and a reference-in terminal and a second reference resonator connected between said signal-out terminal and a reference-out terminal, said first multi-order asynchronous resonator connected between said first matching resonator and said coupling resonator to said first reference terminal and said second multi-order asynchronous resonator connected between said second matching resonator and said coupling resonator to said reference-out terminal, said reference-in terminal connected to said reference-out terminal; and
   a feedback resonator connected between said signal-in terminal and said signal-out terminal.

2. The multi-band band pass filter of claim 1, wherein said first multi-order resonator comprises n second order resonators connected in series each having a different resonant frequency and said second multi-order resonator comprises n second order resonators connected in series each having a different resonant frequency, wherein n is a positive integer of 2 or more.

3. The multi-band band pass filter of claim 2, wherein said first and second multi-order resonators are duplicates of each other, said first and second reference resonators are duplicates of each other, and said first and second matching resonators are duplicates of each other.

4. The multi-band band pass filter of claim 1, wherein said first multi-order resonator comprises two second-order resonators connected in series each having a different resonant frequency and said second multi-order resonator comprises two second-order resonators connected in series each having a different resonant frequency, wherein said first and second multi-order resonators are duplicates of each other.

5. The multi-band band pass filter of claim 1, wherein said first and second matching resonators each include a fixed capacitor and said first and second reference resonators each include a fixed capacitor.

6. The multi-band band pass filter of claim 1, wherein said first and second matching resonators each include a variable capacitor and said first and second reference resonators each include a fixed capacitor.

7. The multi-band band pass filter of claim 1, wherein said first and second matching resonators each include a fixed capacitor and said first and second reference resonators each include a variable capacitor.

8. The multi-band band pass filter of claim 1, wherein said first and second matching resonators each include a variable capacitor and said first and second reference resonators each include a variable capacitor.

* * * * *